(12) United States Patent
Pagnani

(10) Patent No.: US 8,018,348 B1
(45) Date of Patent: Sep. 13, 2011

(54) APPARATUS FOR IDENTIFYING A CIRCUIT BREAKER FEEDING A REMOTELY DISPOSED ELECTRICAL OUTLET AND METHOD OF USING THE APPARATUS

(76) Inventor: David Pagnani, Endicott, NY (US)

( * ) Notice: Subject to any disclaimer, the term of this patent is extended or adjusted under 35 U.S.C. 154(b) by 337 days.

(21) Appl. No.: 12/378,753

(22) Filed: Feb. 19, 2009

(51) Int. Cl.
*G08B 21/00* (2006.01)

(52) U.S. Cl. .......................... 340/635; 340/657; 340/664

(58) Field of Classification Search .................. 340/635, 340/654, 656, 657, 661, 664, 3.5; 324/508, 324/509, 529, 133, 67, 533; 700/83, 275
See application file for complete search history.

(56) References Cited

U.S. PATENT DOCUMENTS

| 5,565,784 | A | | 10/1996 | DeRenne |
| 5,625,285 | A | * | 4/1997 | Virgilio ......................... 324/133 |
| 6,466,029 | B2 | | 10/2002 | Stroth et al. |
| 6,525,665 | B1 | | 2/2003 | Luebke et al. |
| 6,577,243 | B1 | | 6/2003 | Dannenmann et al. |
| 6,850,073 | B2 | | 2/2005 | Elms et al. |
| 6,961,763 | B1 | * | 11/2005 | Wang et al. ................... 709/223 |
| 7,133,729 | B1 | * | 11/2006 | Wang et al. ...................... 700/83 |
| 7,471,075 | B2 | * | 12/2008 | Berland et al. .................. 324/67 |
| 7,701,357 | B2 | * | 4/2010 | Deaver et al. ................. 340/646 |
| 7,795,877 | B2 | * | 9/2010 | Radtke et al. ................. 324/530 |
| 7,804,280 | B2 | * | 9/2010 | Deaver et al. ................. 323/210 |
| 7,872,464 | B2 | * | 1/2011 | Berland et al. .................. 324/67 |

\* cited by examiner

*Primary Examiner* — Van T. Trieu

(74) *Attorney, Agent, or Firm* — Mark Levy; Hinman, Howard & Kattell, LLP

(57) ABSTRACT

An electrical circuit tracing apparatus wherein uniquely identifiable electrical signals are injected into deenergized electrical circuits at a circuit breaker panel. Once the apparatus is electrically connected to multiple deenergized branch circuits, a user may connect a circuit analysis box to successive electrical outlets. The circuit analysis box contains a readout that indicates the circuit number (i.e., 1-n, where n is the number of branch circuits simultaneously testable by the apparatus to which the particular electrical outlet is connected). If a particular electrical outlet is accidentally connected to more than one branch circuit, all of the circuits to which the analyzer box is connected are identified.

12 Claims, 4 Drawing Sheets

APPARATUS FOR IDENTIFYING A CIRCUIT BREAKER FEEDING A REMOTELY DISPOSED ELECTRICAL OUTLET AND METHOD OF USING THE APPARATUS

FIELD OF THE INVENTION

The invention pertains to electrical circuit testers and, more particularly, to an apparatus for determining which portion or branch circuit of an electrical power distribution network feeds a particular remotely located electrical outlet.

BACKGROUND OF THE INVENTION

Electricians, maintenance personnel, homeowners, and other interested persons often need to identify to which circuit breaker a particular electrical outlet is connected. This knowledge is necessary so that a particular branch circuit may be deenergized for maintenance, to deal with an emergency such as flooding of an area, or for other similar reasons. Often, the circuit is identified using two persons, typically equipped with walkie-talkies or similar communications equipment if the distance between the outlet and the breaker box is such that voice communication is impractical. A first person connects a load (e.g., a lamp) to the particular electrical outlet of interest. The second person then sequentially turns circuit breakers off and on until the first person indicates that the lamp or other load is no longer energized. If the circuit breaker associated with more than one outlet must be identified, the lamp or other indicating device must be moved to the second outlet and the process repeated. This procedure is both time consuming and labor intensive.

More recently, electrical testers have been developed that connect a signal-emitting device to the outlet being traced. A probe may then be used at the breaker box or similar termination point to identify which conductor in the breaker box carries the signal from the tester. While this procedure may offer a slight improvement over the method discussed hereinabove, it still requires either two people or multiple trips between the breaker box and the outlets when multiple outlets are being traced. One advantage, however, is that power to multiple circuits need not be systematically interrupted, thereby avoiding the need to reset clocks or other devices requiring a reset after power interruption thereto.

DISCUSSION OF THE RELATED ART

U.S. Pat. No. 5,565,784 for COAXIAL CABLE TESTING AND TRACING DEVICE, issued Oct. 15, 1996 to Lawrence L. DeRenne teaches an apparatus for identifying a number of different coaxial cables emanating from a central location. Up to eight coaxial cables may be terminated at their respective distal ends with a unique terminating device bearing a number between 0 and 7. Each of the terminating devices has a different characteristic impedance. A test apparatus at the central location is sequentially connected to the proximal end of the coaxial cables. Each cable is identified based upon the characteristic impedance of the terminator at the distal end thereof. Open circuits (i.e., coaxial cables having no termination) may also be identified.

U.S. Pat. No. 6,466,029 for POWER LINE TESTING DEVICE WITH SIGNAL GENERATOR AND SIGNAL DETECTOR, issued Oct. 15, 2002 to John E. Stroth et al. teaches a circuit identification system wherein a generated signal has a unique identification component. A signal is injected at an outlet in an electrical power distribution network within a building. A receiver at a breaker box is used to identify the circuit to which the transmitter is connected.

U.S. Pat. No. 6,525,665 for ELECTRICAL CIRCUIT TRACING DEVICE, issued Feb. 25, 2003 to Thomas M. Luebke et al. discloses another compact device wherein a signal is injected into an electrical power distribution network within a building from an electrical outlet to be traced. A receiver stored within the compact tester may then be used at the breaker box to identify the circuit to which the transmitter is connected.

U.S. Pat. No. 6,577,243 for METHOD AND APPARATUS FOR TRACING REMOTE ENDS OF NETWORKING CABLES, issued Jun. 10, 2003 to John Dannenmann et al. discloses an apparatus that may be attached to each end of a network cable. A signal injected at the first end of the cable is detected by a telltale indicator device at the other end of the cable. The system functions without interfering with the normal operation of the network to which the testing apparatus is attached. The DANNENMANN et al. testing apparatus also provides telephonic communication capability between technicians over the cable network being analyzed.

U.S. Pat. No. 6,850,073 for POWER CIRCUIT TESTER APPARATUS AND METHOD, issued Feb. 1, 2005 to Robert T. Elms et al. teaches an apparatus for identifying common wiring errors and for testing ground fault interrupters or other devices using user-selected tests.

None of the patents, taken singly or in any combination, is seen to teach or suggest the novel apparatus and method of identifying a circuit interrupter associated with a particular one of a plurality of electrical outlets connected to any one of a plurality of electrical circuits of the present invention.

SUMMARY OF THE INVENTION

In accordance with the present invention there is provided apparatus wherein uniquely identifiable electrical signals are injected into a plurality of deenergized electrical circuits at a central location, typically a circuit breaker panel. As used herein, the term circuit breaker is used to represent any electrical circuit-interrupting device, including, but not limited to circuit breakers and fuses.

Once the novel device is electrically connected to multiple deenergized branch circuits, a user may move from electrical outlet to electrical outlet and connect a circuit analysis box. The circuit analysis box contains a readout that indicates the circuit number (i.e., 1-n where n is the number of branch circuits simultaneously testable by the apparatus of the invention) to which the particular electrical outlet is connected. If a particular electrical outlet is accidentally connected to two branch circuits, the numbers of both the circuits to which the analyzer box is connected are both identified and displayed.

It is therefore an object of the invention to provide an apparatus for identifying a particular circuit breaker feeding a remotely disposed electrical outlet.

It is another object of the invention to provide an apparatus for identifying a particular circuit breaker feeding a remotely disposed electrical outlet wherein multiple circuits may simultaneously be injected with uniquely identifiable test signals.

It is an additional object of the invention to provide an apparatus for identifying a particular circuit breaker feeding a remotely disposed electrical outlet wherein an analysis box electrically connected at a particular electrical outlet identifies to which of the multiple circuits the outlet is connected.

It is a further object of the invention to provide an apparatus for identifying a particular circuit breaker feeding a remotely disposed electrical outlet wherein, when an outlet is connected to more than one electrical branch circuit, each of the more than one branch circuits may readily be identified.

It is a still further object of the invention to provide an apparatus for identifying a particular circuit breaker feeding a remotely disposed electrical outlet wherein a safety apparatus protects the apparatus from harm if one or more electrical circuits to which the apparatus is connected accidentally becomes energized.

BRIEF DESCRIPTION OF THE DRAWINGS

Various objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENT

The present invention provides an apparatus and method for readily identifying to which of a plurality of deenergized electrical branch circuits within an electrical power distribution network an electrical outlet is connected. As used herein, the term "electrical power distribution network" includes only electrical branch circuits beyond a series of electrical circuit interrupters (for example, circuit breakers disposed in a circuit breaker panel). In a home or other small building, there may be only one such circuit breaker panel, often referred to as a "breaker box" whereas in a larger building, multiple circuit breaker panels (i.e., subpanels) may exist.

It is often necessary to deenergize an electrical circuit supplying electrical power to a particular electrical outlet or other load. As used herein, the term "electrical outlet" is intended to include any connector or terminal device providing power to a load, whether the load is pluggable or permanently wired to the electrical branch circuit. Circuit deenergization may be required, for example, to perform maintenance on the circuit, add a new outlet or other load to the circuit, or to respond to an emergency situation involving a branch circuit, etc.

Figure 1:
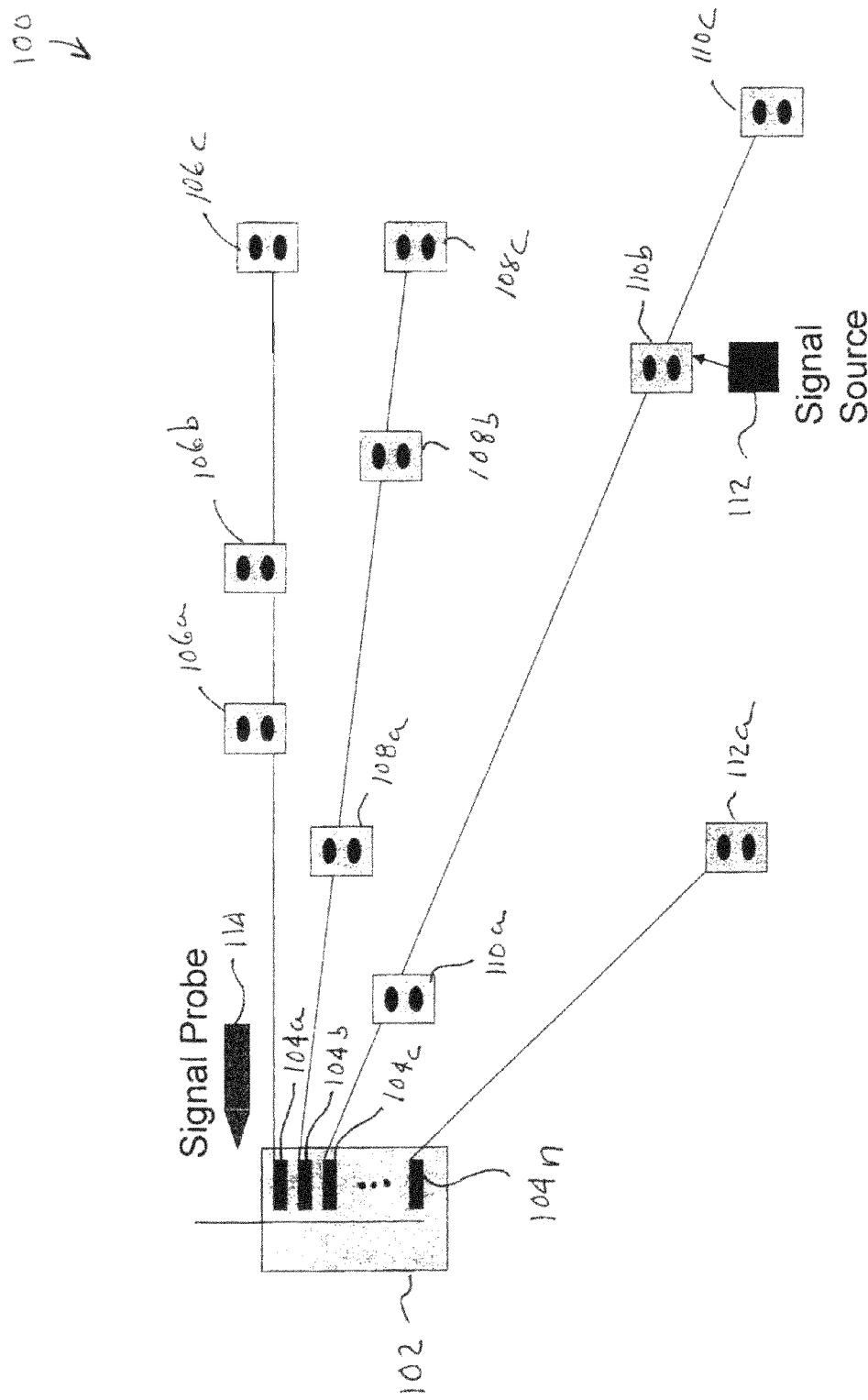
FIG. 1 is a simplified system block diagram of an electrical circuit identification system of the prior art.

Referring first to FIG. 1, there is shown a simplified system block diagram 100 of a portion of a typical electrical power distribution network undergoing testing in accordance with the prior art. A breaker panel 102 contains circuit breakers 104a, 104b, 104c, . . . , 104n, each controlling power flow to a branch circuit. Connected to circuit breaker 104a are electrical outlets 106a, 106b, 106c. Likewise, connected to circuit breaker 104b are electrical outlets 108a, 108b, 108c. Outlets 110a, 110b, and 110c are connected to circuit breaker 104c. Finally, outlet 112a is connected to circuit breaker 104n.

An electrical signal source 112 is connected to electrical outlet 110b.

A signal probe 114 is provided to determine to which of circuit breakers 104a, 104b, 104c, . . . , 104n signal source 112 is connected.

In operation, all circuit breakers 104a, 104b, 104c, . . . , 104n are typically opened to deenergize any electrical circuits of interest. Some embodiments of similar prior art tracing systems may be used with energized circuits. Once signal source 112 is connected to the desired electrical outlet 106a, 106b, . . . , 112a, signal probe 114 is used to detect a signal at each circuit breaker 104a, 104b, 104c, . . . , 104n at the breaker box 102. The circuit breaker 104a, 104b, 104c, . . . , 104n presenting the highest signal, not shown, to circuit probe 114 is the circuit breaker associated with the selected electrical outlet, in the illustrated case, electrical outlet 110b connected to circuit breaker 104c.

This apparatus and the method of testing associated therewith are disadvantageous for several reasons. First, to determine which associated circuit breakers 104a, 104b, 104c, . . . , 104n are connected to several outlets 106a, 106b, . . . , 112a, numerous trips between the outlet 106a, 106b, . . . , 112a being traced and the breaker box 102 must be made. Also, each successive circuit breaker 104a, 104b, 104c, . . . , 104n must be probed until the desired circuit breaker 104a, 104b, 104c, . . . , 104n is located. In electrical wiring installations where cables run in close proximity to one another, it is also possible that similar signals may appear at more than one circuit breaker 104a, 104b, 104c, . . . , 104n due to inductive coupling. When this happens, additional testing may be required to definitively identify the correct circuit breaker 104a, 104b, 104c, . . . , 104n associated with a particular electrical outlet 106a, 106b, . . . , 112a.

Figure 2:
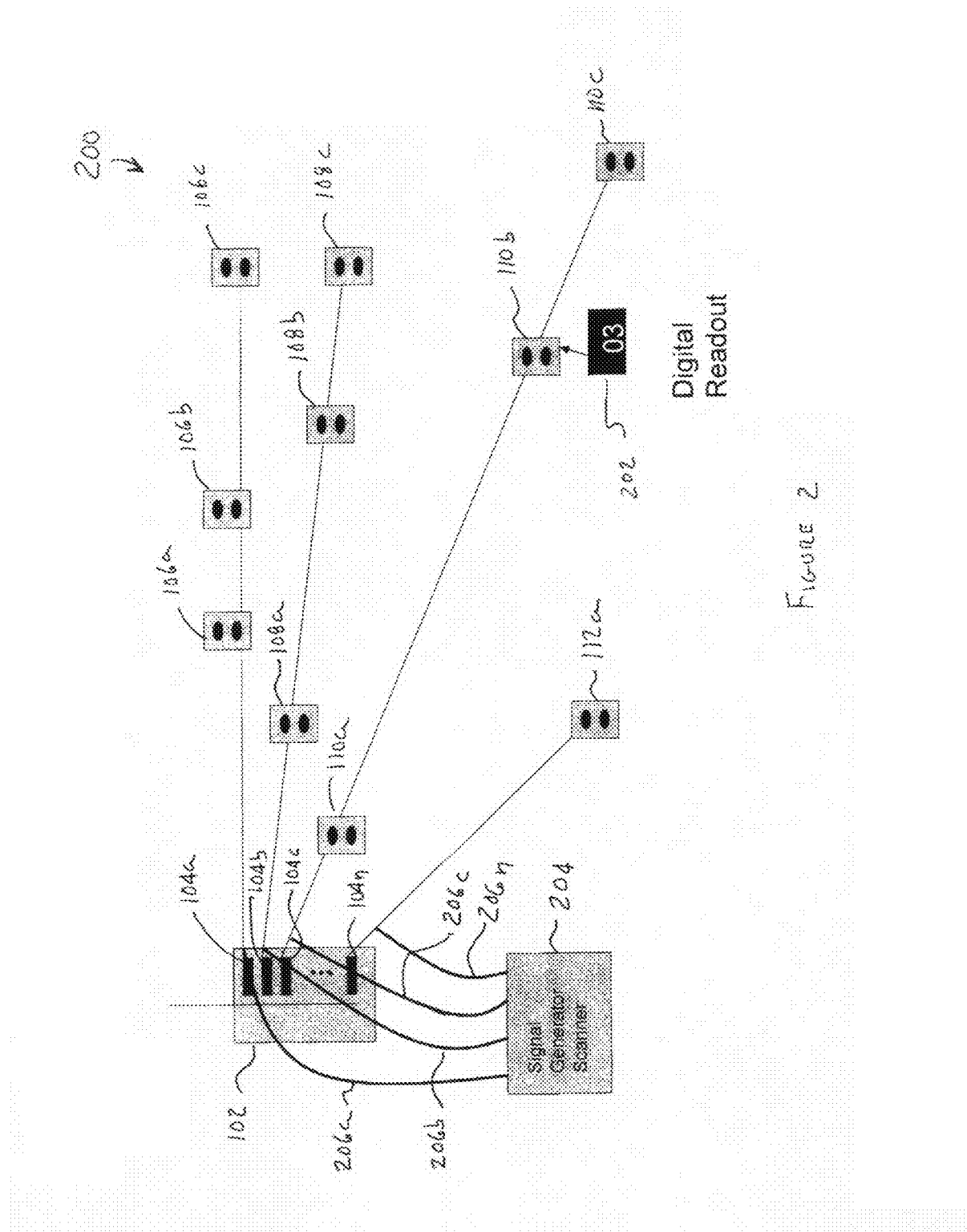
FIG. 2 is a simplified system block diagram showing the apparatus of the invention connected to an electrical power distribution network within a building.

Referring now to FIG. 2, there is shown a simplified system block diagram 200 of a portion of a typical electrical power distribution network undergoing testing in accordance with the apparatus and method of the present invention.

A breaker panel 102 contains circuit breakers 104a, 104b, 104c, . . . , 104n. Connected to circuit breaker 104a are electrical outlets 106a, 106b, 106c. Likewise, connected to circuit breaker 104b are electrical outlets 108a, 108b, 108c. Outlets 110a, 110b, and 110c are connected to circuit breaker 104c. Finally, outlet 112a is connected to circuit breaker 104n. Outlets 104a, 104b, . . . , 112a are connected to respective branch circuits associated with of circuit breakers 104a, 104b, 104c, . . . , 104n as described hereinabove.

A multi-output electrical signal generating test apparatus 204 is equipped with output connections 206a, 206b, 206c, . . . , 206n, each output 206a, 206b, 206c, . . . , 206n being connected to a respective one of the branch circuits connected to circuit breakers 104a, 104b, 104c, . . . , 104n.

A digital readout 202 is connected to outlet 110b that is, in turn, connected to circuit breaker 104c.

Figure 3:
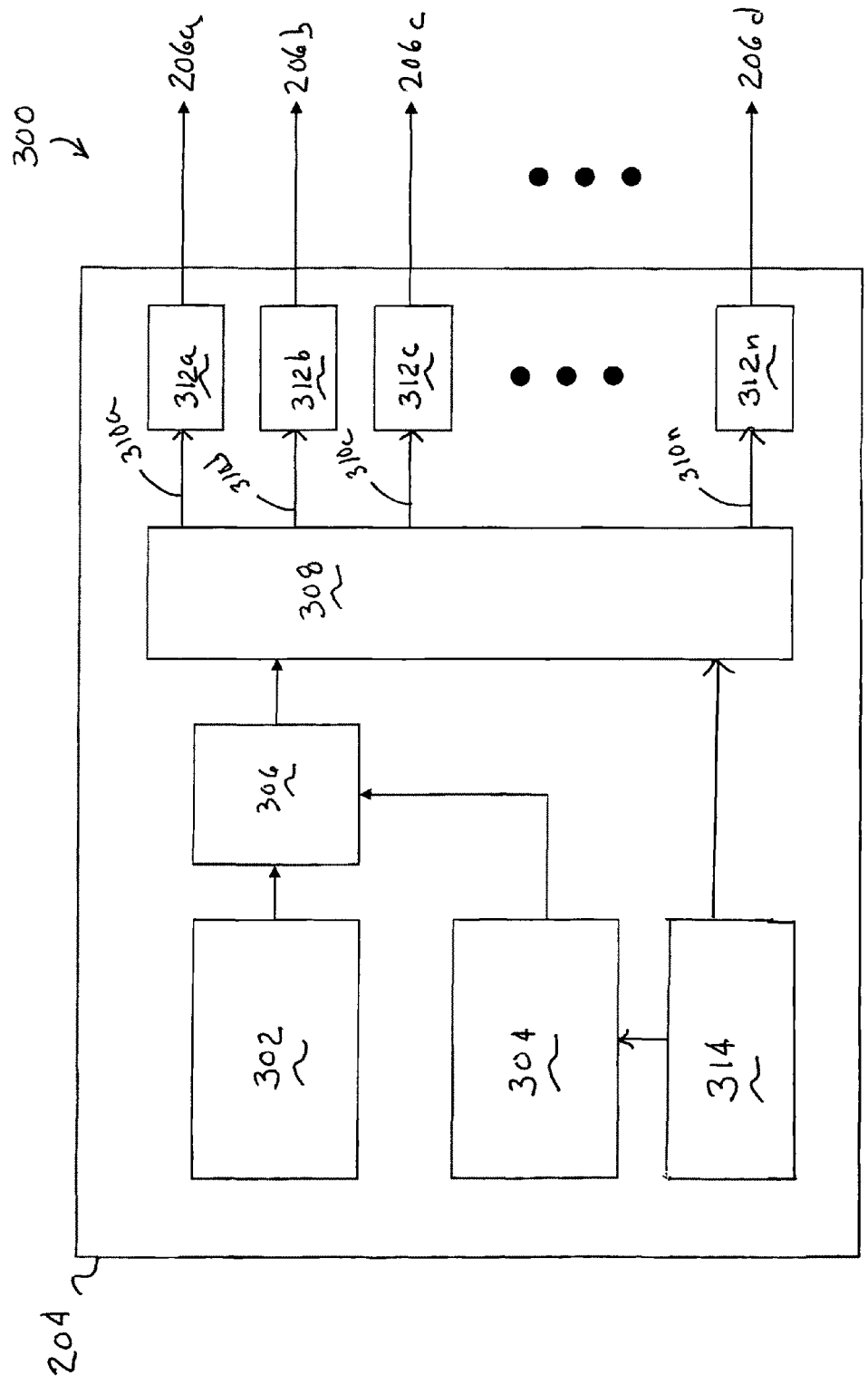
FIG. 3 is a simplified functional block diagram of one embodiment of the electrical testing apparatus in accordance with the invention.

Referring now also to FIG. 3, there is shown a simplified functional block diagram of the inventive electrical signal generating test apparatus 204, generally at reference number 300. Electrical signal generating test apparatus 204 consists of a signal generator 302 and a unique address generator 304. Outputs of signal generator 302 and unique address generator 304 are connected to input of a modulator/mixer 306.

The output of modulator/mixer 306 is connected to the input of a sequencer 308. Sequencer 308 has a plurality of outputs 310a, 310b, 310c, . . . , 310n. Respective sequencer outputs 310a, 310b, 310c, . . . , 310n are connected to inputs to driver/isolator circuits 312a, 312b, 312c, . . . , 312n. Output of drivers 312a, 312b, 312c, . . . , 312n form, respectively, outputs 206a, 206b, 206c, . . . , 206n as shown in FIG. 2.

A timer/controller 314 is operatively connected to unique address generator 304 and sequencer 308 to synchronize the switching of outputs 310a, 310b, 310c, . . . , 310n to match a correct unique address being generated by unique address generator 304.

Figure 4:
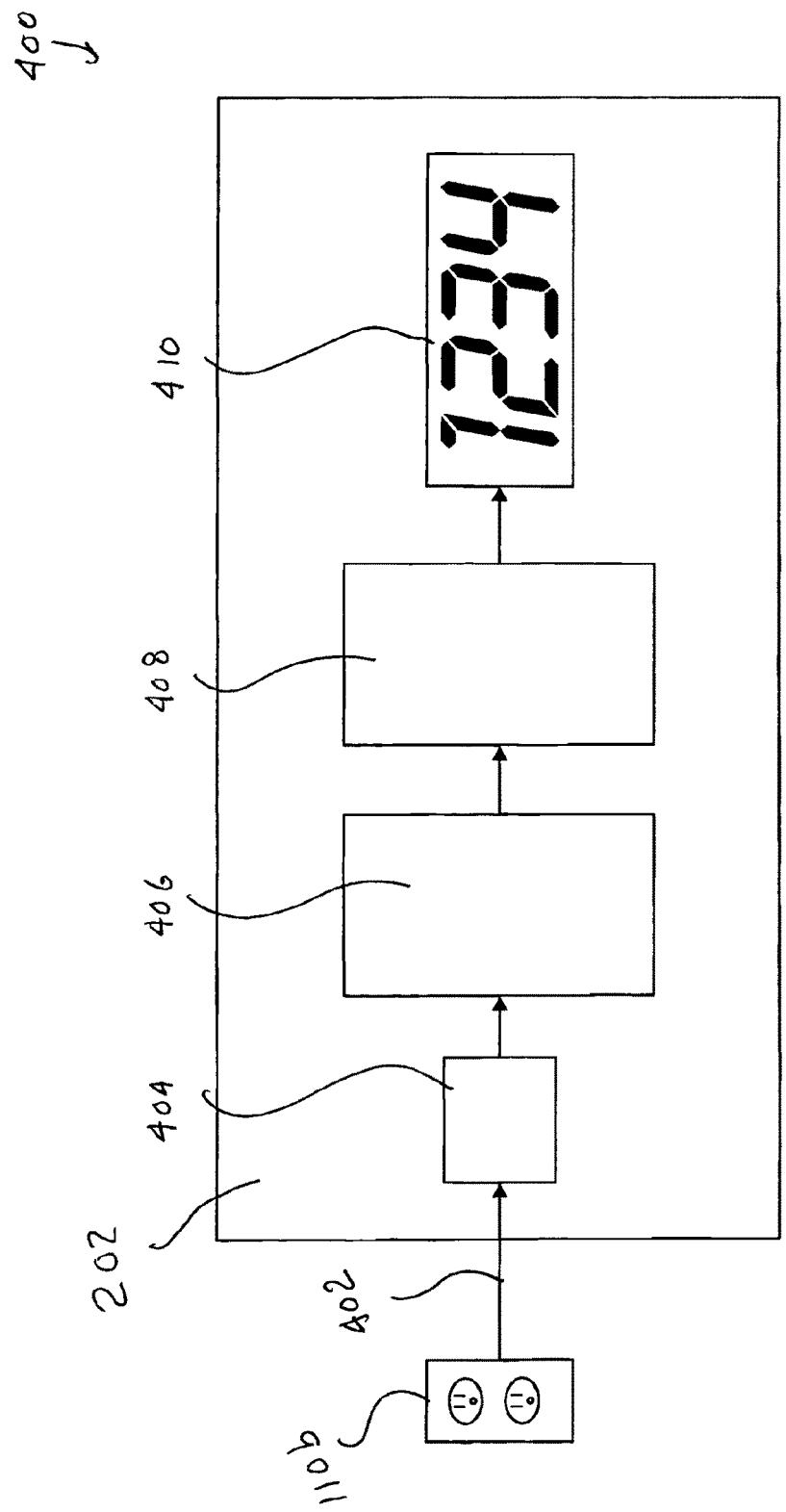
FIG. 4 is a simplified functional block diagram of a digital readout for use with the electrical testing apparatus of FIG. 3 in accordance with the invention.

Referring now also to FIG. 4, there is shown a simplified functional block diagram 400 of digital readout 202 adapted for connection to one of electrical outlets 106a, 106b, . . . , 112a. Digital readout 202 has an input connection 402, typically terminating in a standard plug, not shown, for interconnection with a standard duplex or similar electrical outlet 110b.

Input connection 402 is connected to the input of an interface and protection circuit 404. The output of interface and protection circuit 404 is connected to a decoding circuit 406. The output of decoding circuit 406 is, in turn, connected to the input of a display driver circuit 408.

The output of display driver circuit 408 is connected to a numeric display 410. While four digits are shown on numeric display 410, it will be recognized that more or fewer digits may be utilized to accommodate and uniquely identify the maximum number of channels of electrical signal generating test apparatus 204. It will be further recognized that other indicating means, for example, a series of LEDs, not shown, or other similar indicators may be used in place of numeric display 410 to indicate the channel to which digital readout 202 is connected. Consequently, the invention is not limited to the digital display chosen for purposes of disclosure. Rather, the invention includes any and all display technologies capable of uniquely indicating the channel to which digital display 204 is connected.

In the example chosen for purposes of disclosure, only four output circuits 206a, 206b, . . . , 206d are shown. It will be recognized that any number of outputs may be provided to meet a particular operating circumstance or environment. For example, an 8-output device may be suitable for typical home and small building testing. Devices having 16, 32 or more outputs may be useful for circuit tracing in industrial and commercial environments. Consequently, the invention in not considered limited to the four outputs chosen for purposes of disclosure but rather includes any number of outputs.

It will be further recognized that many technologies may be used to transmit uniquely identifiable signals across a plurality of channels. For example, a digital signal having a unique address encoded therein may be sent. Analog technologies using varying modulation frequencies, frequency shift keying, or many other technologies are believed to be known to those of skill in the art to implement the electrical testing apparatus 204 and digital readout 202 of the present invention. Consequently, specific technical details are not further discussed herein.

In an alternate embodiment of the novel apparatus of the present invention, a carrier current-based implementation may be used to trace energized circuits. One well-known implementation of a carrier-current communications is the so-called X10™ system. In the X10 system, household electrical wiring is utilized to send digital data between X10 devices. The digital data is encoded onto a 120 kHz carrier which is transmitted as bursts during the relatively quiet zero crossings of the 50 or 60 Hz AC alternating current waveform. One bit is typically transmitted at each zero crossing. The digital data consists of an address and a command sent from a controller to a controlled device. By sending unique X10 commands on each implemented channel of the novel signal generating test apparatus 204, the remote digital readout 202 may readily identify the channel (i.e., the branch circuit of the electrical power distribution network) connected to the electrical outlet currently connected to the digital readout 202.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A circuit tracing apparatus, comprising:
   a) a signal generating test apparatus having at least two outputs adapted and configured for connection, respectively, to at least two different branch circuits of an electrical power distribution network simultaneously, each of said at least two outputs comprising a uniquely identifiable signal; and
   b) a signal receiving apparatus adapted and configured for connection to one of said at least two different branch circuits of said electrical power distribution network, said signal receiving apparatus comprising means for identifying at least one of said uniquely identifiable signals, and a display for indicating which of said at least two outputs is associated therewith.

2. The circuit tracing apparatus as recited in claim 1, wherein said uniquely identifiable signal comprises at least one signal type from the group: digital signal, and analog signal.

3. The circuit tracing apparatus as recited in claim 1, wherein said at least two different branch circuits of an electrical power distribution network comprise deenergized branch circuits.

4. The circuit tracing apparatus as recited in claim 3, wherein said at least one of said signal generating test apparatus and said signal receiving apparatus comprises a safety circuit adapted and configured to protect said at least one of said signal generating test apparatus and said signal receiving apparatus if any of said at least two different branch circuits of an electrical power distribution network become energized.

5. The circuit tracing apparatus as recited in claim 1, wherein said at least two different branch circuits of an electrical power distribution network comprise energized branch circuits.

6. The circuit tracing apparatus as recited in claim 5, wherein said signal generating test apparatus and said signal receiving apparatus comprise means for communicating with each other utilizing carrier current communications.

7. The circuit tracing apparatus as recited in claim 6, wherein said carrier current communications is in accordance with an X10 protocol.

8. A method of tracing an electrical network, the steps comprising:
   a) providing a multi-output, signal generating electrical test apparatus configured to provide a uniquely identifiable electrical signal simultaneously at each output thereof;
   b) providing a readout device compatible with said multi-output, signal generating electrical test apparatus;
   c) deenergizing all branch circuits to be tested in an electrical power distribution network to create at least one deenergized branch circuit;
   d) connecting an output of said multi-output, signal generating electrical test apparatus to each of said at least one deenergized branch circuit; and
   e) connecting said readout device to an electrical outlet connected to said at least one deenergized circuit.

9. The method of tracing an electrical network as recited in claim 8, the steps further comprising:
   f) reading an indication from said readout device indicating which of said multiple outputs of said multi-output, signal generating electrical test apparatus is connected to the one of said at least two deenergized circuits connected to said electrical outlet.

10. The method of tracing an electrical network as recited in claim 9, wherein said providing step (b) comprises providing a readout device comprising a digital readout.

11. The method of tracing an electrical network as recited in claim 8, wherein said providing step (a) comprises providing a multi-output, signal generating electrical test apparatus having at least four outputs and configured to provide a uniquely identifiable electrical signal at each of said at least four outputs.

12. The method of tracing an electrical network as recited in claim 8, wherein said providing step (a) comprises providing a multi-output, signal generating electrical test apparatus having at least eight outputs and configured to provide a uniquely identifiable electrical signal at each of said at least eight outputs.

* * * * *